(12) United States Patent
Vadnerkar et al.

(10) Patent No.: US 11,112,481 B2
(45) Date of Patent: Sep. 7, 2021

(54) DIFFERENTIAL CIRCUIT CALIBRATION APPARATUS AND METHOD

(71) Applicant: Cirrus Logic International Semiconductor Ltd., Edinburgh (GB)

(72) Inventors: Sarang Vadnerkar, Austin, TX (US); Vinod Jayakumar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 323 days.

(21) Appl. No.: 16/418,710

(22) Filed: May 21, 2019

(65) Prior Publication Data

US 2019/0361087 A1 Nov. 28, 2019

Related U.S. Application Data

(60) Provisional application No. 62/676,037, filed on May 24, 2018.

(51) Int. Cl.
| | |
|---|---|
| *G01R 35/00* | (2006.01) |
| *H03K 5/24* | (2006.01) |
| *H03G 3/20* | (2006.01) |
| *G01R 19/10* | (2006.01) |
| *H03M 1/10* | (2006.01) |
| *H03M 1/00* | (2006.01) |
| *H02M 3/07* | (2006.01) |
| *H03F 3/217* | (2006.01) |

(52) U.S. Cl.
CPC ............ *G01R 35/005* (2013.01); *G01R 19/10* (2013.01); *H03G 3/20* (2013.01); *H03K 5/24* (2013.01); *H03M 1/00* (2013.01); *H03M 1/1057* (2013.01); *H02M 3/07* (2013.01); *H03F 3/217* (2013.01); *H03F 2200/03* (2013.01)

(58) Field of Classification Search
CPC ........ G01R 35/005; G01R 19/10; H03K 5/24; H02M 3/07; H03G 1/0088; H03G 3/20; H03M 1/765; H03M 1/00; H03M 1/1057; H03F 2203/45512; H03F 2203/45048; H03F 3/45475; H03F 2200/03; H03F 3/217
USPC ......................................... 341/120, 143, 155
See application file for complete search history.

(56) References Cited

U.S. PATENT DOCUMENTS

| | | | |
|---|---|---|---|
| 9,379,612 B2 * | 6/2016 | Ozawa | H02M 3/158 |
| 2016/0073465 A1 * | 3/2016 | Tao | H05B 45/3725 |
| | | | 398/140 |

* cited by examiner

*Primary Examiner* — Khai M Nguyen
(74) *Attorney, Agent, or Firm* — E. Alan Davis; James W. Huffman

(57) ABSTRACT

An apparatus for calibrating a differential circuit that includes a differential integrator having an input, a gain, and an output connected to a comparator. The differential integrator output is chargeable to a threshold prior to an integration period. The differential integrator integrates the input during the integration period such that the differential integrator output goes toward zero from the threshold. The comparator detects the output of the differential integrator reaching zero. The apparatus includes a closed-loop gain trim circuit to perform a coarse calibration to adjust and set the gain of the differential integrator and a reference generator that generates the threshold to which the differential integrator output is pre-charged. The reference generator is trimmable during a fine calibration to adjust and set the threshold to correct for residual gain error in the differential circuit remaining after the coarse calibration is performed.

25 Claims, 8 Drawing Sheets

DIFFERENTIAL CIRCUIT CALIBRATION APPARATUS AND METHOD

CROSS REFERENCE TO RELATED APPLICATION(S)

This application claims priority based on U.S. Provisional Application Ser. No. 62/676,037, filed May 24, 2018, which is hereby incorporated by reference in its entirety.

BACKGROUND

Many electronic circuits draw current from a power source, e.g., a battery. In some cases, it may be necessary to monitor the amount of current being drawn from the power source, e.g., to regulate the current to avoid damage to the power source. As an example, a Class-D amplifier may be powered by a capacitive charge pump power supply system, and a current may flow from a battery into the charge pump in a charge pump switching cycle. It may also be necessary to monitor the amount of current to avoid damage to the charge pump due to excessive current on capacitors thereof or to regulate and budget the power consumed by an integrated circuit that includes the class-D amplifier and the charge pump. The average current from the battery into the charge pump in a charge pump switching cycle may need to be compared to a reference with very high accuracy requirements.

SUMMARY

A gain calibration method and system embodied within a charge pump of an amplifier are described. The current, e.g., from a battery, to be integrated is sensed by a resistor and integrated by a differential integrator. A coarse trim is applied on the gain of the differential integrator. A fine trim is applied on a bandgap reference voltage. The bandgap reference voltage, also referred to as a common mode voltage $V_{CM}$, is converted to a differential reference, or threshold, using circuit techniques. Using circuit techniques (e.g., sizing Digital-to-Analog Converter (DAC) elements), a single point calibration may ensure that accuracy is met over a range of current levels.

In one embodiment, the present disclosure provides an apparatus for calibrating a differential circuit that includes a differential integrator having an input, a gain, and an output connected to a comparator, wherein the differential integrator output is chargeable to a threshold prior to an integration period, wherein the differential integrator integrates the input during the integration period such that the differential integrator output goes toward zero from the threshold, wherein the comparator detects the output of the differential integrator reaching zero. The apparatus includes a closed-loop gain trim circuit to perform a coarse calibration to adjust and set the gain of the differential integrator and a reference generator that generates the threshold to which the differential integrator output is pre-charged. The reference generator is trimmable during a fine calibration to adjust and set the threshold to correct for residual gain error in the differential circuit remaining after the coarse calibration is performed.

In another embodiment, the present disclosure provides a method for calibrating a differential circuit that includes a differential integrator having an input, a gain, and an output connected to a comparator, wherein the differential integrator output is chargeable to a threshold prior to an integration period, wherein the differential integrator integrates the input during the integration period such that the differential integrator output goes toward zero from the threshold, wherein the comparator detects the output of the differential integrator reaching zero. The method includes performing, in a closed-loop manner, a coarse calibration to adjust and set the gain of the differential integrator. The method also includes performing a fine calibration of a trimmable reference generator that generates the threshold to which the differential integrator output is pre-charged by adjusting and setting the threshold to correct for residual gain error in the differential circuit remaining after the coarse calibration is performed.

In yet another embodiment, the present disclosure provides a non-transitory computer-readable medium having instructions stored thereon that are capable of causing or configuring an apparatus for calibrating a differential circuit that includes a differential integrator having an input, a gain, and an output connected to a comparator, wherein the differential integrator output is chargeable to a threshold prior to an integration period, wherein the differential integrator integrates the input during the integration period such that the differential integrator output goes toward zero from the threshold, wherein the comparator detects the output of the differential integrator reaching zero, wherein the instructions cause or configure the apparatus to perform operations that include performing, in a closed-loop manner, a coarse calibration to adjust and set the gain of the differential integrator, and performing a fine calibration of a trimmable reference generator that generates the threshold to which the differential integrator output is pre-charged by adjusting and setting the threshold to correct for residual gain error in the differential circuit remaining after the coarse calibration is performed.

DETAILED DESCRIPTION

Figure 1:
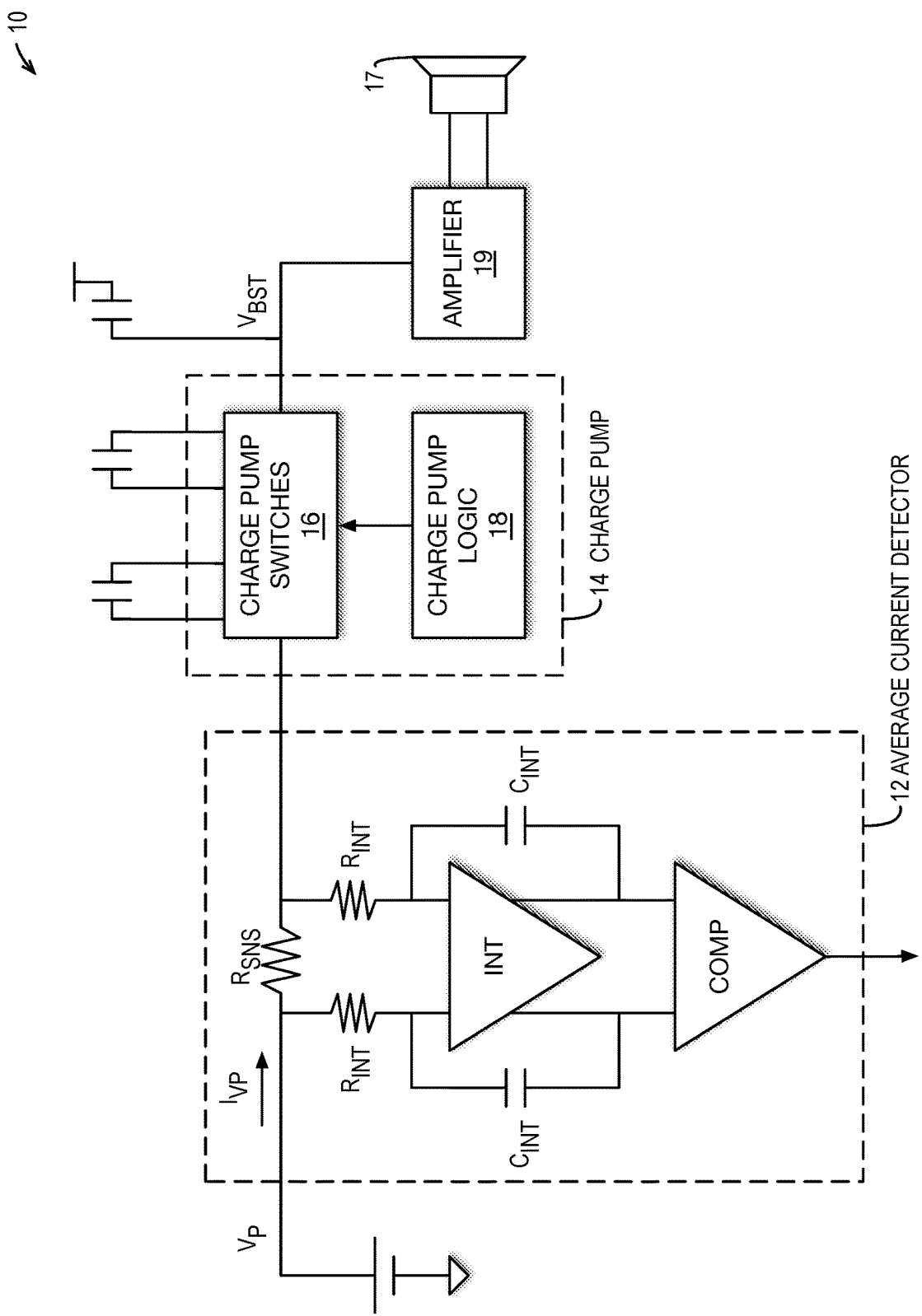
FIG. 1 is a block diagram of an example system in accordance with embodiments of the present disclosure.

FIG. 1 is a block diagram of an example system 10 in accordance with embodiments of the present disclosure. The example system 10 has an average current detector 12, a charge pump 14, and an amplifier 19. The charge pump 14 includes charge pump switches 16 and charge pump logic 18. A supply current $I_{VP}$ is fed into the charge pump 14. In the embodiment of FIG. 1, a power supply (e.g., a battery) supplies a voltage $V_P$ to provide the supply current $I_{VP}$. The supply current $I_{VP}$ is closely monitored by the average current detector 12 and regulated. The charge pump 14 provides a boost voltage $V_{BST}$ that further helps power the amplifier 19. In the example of FIG. 1, the amplifier 19 may drive a speaker 17.

Figure 2:
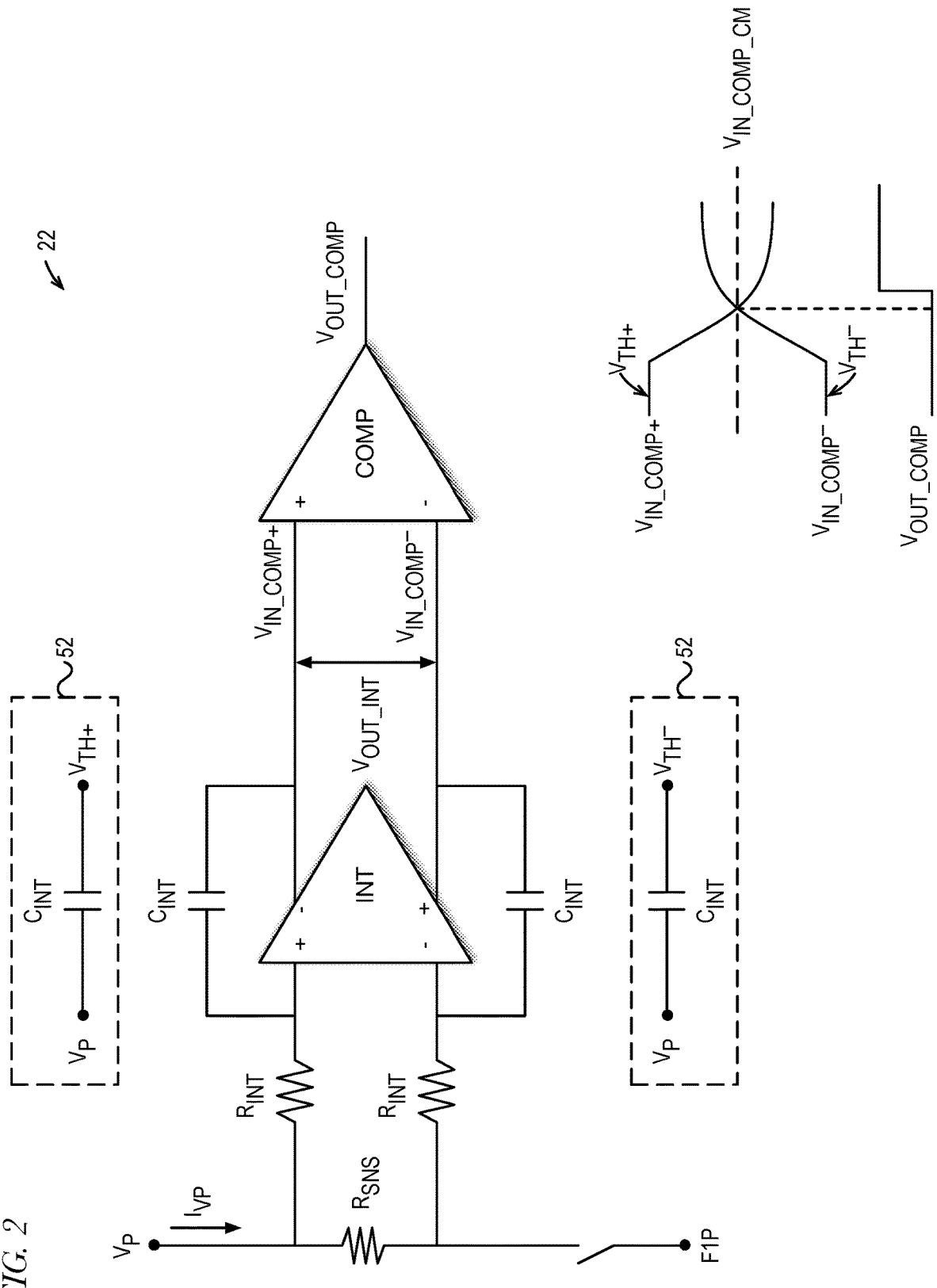
FIG. 2 is a circuit diagram of a current sense system, or path, and a graph illustrating operation thereof according to an embodiment of the average current detector of FIG. 1.

The average current detector 12 includes a differential integrator INT whose output is provided to a comparator COMP whose operation is described in more detail below. A sense resistor $R_{SNS}$ of the average current detector 12 senses the supply current $I_{VP}$. In one embodiment, the sense resistor $R_{SNS}$ is a resistor whose resistance is highly temperature-insensitive (e.g., tantalum resistor, tantalum nitride resistor, or other low temperature coefficient resistor). The terminals of the sense resistor $R_{SNS}$ are coupled to respective inputs of the differential integrator INT through a pair of integrating resistors $R_{INT}$. A pair of integrating capacitors $C_{INT}$ connect inputs to outputs of the differential integrator INT. More specifically, a first integrating capacitor $C_{INT}$ connects the non-inverting input to the inverting output of the differential integrator INT and a second integrating capacitor $C_{INT}$ connects the inverting input to the non-inverting output, as shown in FIG. 2. The differential integrator INT integrates the supply current $I_{VP}$ over a switching cycle, or integration period T.

The gain for the differential integrator INT is calibrated by the calibration method and apparatus in accordance with embodiments of the present disclosure so that high accuracy requirements for providing the average current are satisfied. The calibration of the gain is performed by both a coarse trim and a fine trim that are applied on the gain of the differential integrator INT. In one embodiment, after the coarse and fine calibration are performed, the average current in the integration period may be known with greater than 1% accuracy.

FIG. 2 is a circuit diagram of a current sense (ISNS) system 22, or path, and a graph illustrating operation thereof according to an embodiment of the average current detector 12 of FIG. 1. The current sense system 22 includes four main sub-blocks: a differential integrator INT (e.g., differential integrator INT of FIG. 1), a comparator COMP (e.g., comparator COMP of FIG. 1), a comparator reference generator 52 (see FIG. 5, for example), and a single-ended reference generator 62 (see FIG. 6, for example). The single-ended reference generator 62 generates a single-ended common mode reference voltage $V_{CM}$. The comparator reference generator 52 generates a differential comparator reference threshold $V_{TH+}$ and $V_{TH-}$ based on the single-ended common mode reference voltage $V_{CM}$. The supply current $I_{VP}$ (e.g., of FIG. 1) generated by a supply voltage $V_P$ is detected or sensed by a sense resistor $R_{SNS}$ (e.g., $R_{SNS}$ of FIG. 1). The differential integrator INT integrates the voltage sensed across the sense resistor $R_{SNS}$ over one integration period. The output $V_{OUT\_INT}$ of the differential integrator INT is then compared by the comparator COMP to a set differential comparator reference threshold $V_{TH+}$-$V_{TH-}$ to determine whether the supply current $I_{VP}$ integrated over the integration period exceeds the threshold. The inverting output of the differential integrator INT is connected to the non-inverting input $V_{IN\_COMP+}$ of the comparator COMP, and the non-inverting output of the differential integrator INT is connected to the inverting input $V_{IN\_COMP-}$ of the comparator COMP.

As shown in the embodiment of FIG. 2, each integrating capacitor $C_{INT}$ comprises a pair of integrating capacitors $C_{INT}$, or flycaps. During an integrating period, a first flycap of the pair is connected across the differential integrator INT to perform integration while the second flycap of the pair is connected to the comparator reference generator 52 to be pre-charged to its threshold value ($V_{TH+}$ or $V_{TH-}$). During the next integrating period, a second flycap is connected across the differential integrator INT to perform integration while the first flycap is connected to the comparator reference generator 52 to be pre-charged to its threshold value ($V_{TH+}$ or $V_{TH-}$). This operation continues in a ping-pong fashion for each pair of integrating capacitors $C_{INT}$. Thus, at the start of the integration period, the integrating capacitors $C_{INT}$ are pre-charged, or refreshed, differentially to $V_{TH+}$-$V_{TH-}$, i.e., the comparator reference threshold, as shown in the graph. More specifically, the non-inverting input $V_{IN\_COMP+}$ of the comparator COMP is pre-charged to $V_{TH+}$, and the inverting input $V_{IN\_COMP-}$ of the comparator COMP is pre-charged to $V_{TH-}$. The graph illustrates detection of an instance of an over-threshold condition. As shown in the graph, once the integration period begins, $V_{IN\_COMP+}$ decreases from its pre-charged value of $V_{TH+}$ until it crosses an input common mode value $V_{IN\_COMP\_CM}$ (which is the single-ended reference voltage $V_{CM}$) and $V_{IN\_COMP-}$ increases from its pre-charged value of $V_{TH-}$ until it crosses the input common mode value $V_{IN\_COMP\_CM}$, at which point the value of the output $V_{OUT\_INT}$ of the differential integrator INT is zero, which indicates the integrated value of the supply current $I_{VP}$ during the switching period has reached the comparator COMP reference threshold $V_{TH+}$-$V_{TH-}$. The output $V_{OUT\_COMP}$ of the comparator COMP indicates when (and if) the integrated value of the supply current $I_{VP}$ has reached the comparator COMP reference threshold $V_{TH+}$-$V_{TH-}$. The value of the output $V_{OUT\_COMP}$ is initially low and transitions to a high value when (after a delay of the comparator COMP) the comparator COMP inputs $V_{IN\_COMP+}$ and $V_{IN\_COMP-}$ have crossed the common mode value $V_{IN\_COMP\_CM}$, i.e., when the integrated supply current $I_{VP}$ has exceeded the comparator reference threshold $V_{TH+}$-$V_{TH-}$, which is when the output $V_{OUT\_INT}$ of the differential integrator INT reaches zero.

The magnitude of the integrated value of the supply current $I_{VP}$ by the differential integrator INT (i.e., excluding output inversion and pre-charging the comparator COMP input) is given by equation (1).

$$V_{OUT\_INT} = \frac{I_{VP} * R_{SNS}}{R_{INT} * C_{INT} * F_{SW}} \quad (1)$$

where $F_{SW}$ is the switching frequency, which is the reciprocal of the integration period T.

Figure 3:
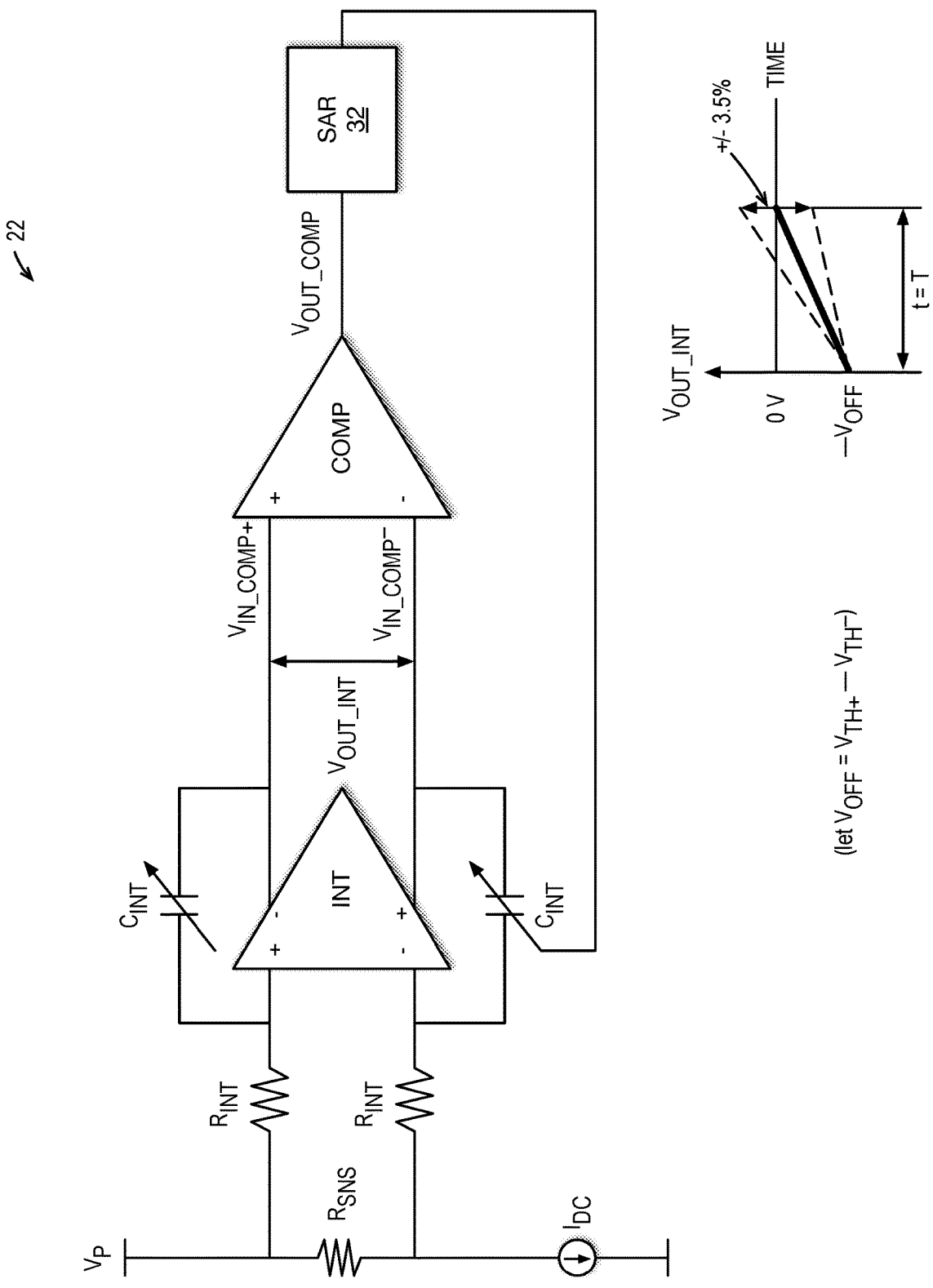
FIG. 3 is a circuit diagram of the current sense system of FIG. 2 and a graph illustrating coarse trim of the gain of the differential integrator of FIG. 2 according to embodiments of the present disclosure.

FIG. 3 is a circuit diagram of the current sense system 22 of FIG. 2 and a graph illustrating coarse trim of the gain of the differential integrator INT of FIG. 2 according to embodiments of the present disclosure. As shown in FIG. 3, a current source (rather than the charge pump 14 of FIG. 1, for example) is connected during calibration to draw a current $I_{DC}$ across the sense resistor $R_{SNS}$. As also shown in FIG. 3, a successive approximation register (SAR) circuit receives the output $V_{OUT\_COMP}$ of the comparator COMP. As also shown in FIG. 3, the capacitances of the integrating capacitors $C_{INT}$ of FIG. 2 are variable and may therefore be adjusted, or trimmed, so that a coarse range for the gain of the differential integrator INT is set. A control circuit (not shown) uses the SAR data in a closed-loop fashion to trim the capacitance of the integrating capacitors $C_{INT}$. In an alternate embodiment, the capacitance of the integrating capacitors $C_{INT}$ may be trimmed linearly. By adjusting the capacitances of the integrating capacitors $C_{INT}$, the gain of the differential integrator INT (which is essentially a function of the values of $R_{SNS}$, $R_{INT}$ and $C_{INT}$, as may be observed from equation (1) above and equation (3) below) is adjusted such that, in effect, the slope of the line representing the output $V_{OUT\_INT}$ of the differential integrator INT going to a zero-crossing is adjusted and set, as shown in the graph of FIG. 3. More specifically, as shown in the graph, the output $V_{OUT\_INT}$ of the differential integrator INT rises linearly over time from its initial pre-charged value of $-V_{OFF}$ to zero Volts over the integration period T, where $V_{OFF}$ is the comparator reference threshold $V_{TH+}-V_{TH-}$, as expressed in equation (2).

$$V_{OFF} = V_{TH+} - V_{TH-} \quad (2)$$

As shown, the output $V_{OUT\_INT}$ of the differential integrator INT may vary according to the precision of the trimmable integrating capacitors $C_{INT}$. In one embodiment, the gain of differential integrator INT may be adjusted by adjusting the capacitance of $C_{INT}$ such that the zero-crossing of the output $V_{OUT\_INT}$ of the differential integrator INT may be calibrated to within a coarse range of plus or minus 3.5%. In an alternate embodiment, trimmable resistors may be employed in place of the trimmable integrating capacitors $C_{INT}$ in order to adjust the gain of differential integrator INT.

The output $V_{OUT\_INT}$ of the differential integrator INT is expressed in equation (3)

$$V_{OUT\_INT} = -V_{OFF} + \frac{I_{DC} * R_{SNS}}{R_{INT}} * \frac{1}{C_{INT}} * T \quad (3)$$

where $I_{DC}$ is the current drawn across the sense resistor, $R_{SNS}$ is the resistance of the sense resistor, $R_{INT}$ is the resistance of the integrating resistors, $C_{INT}$ is the adjusted capacitance of the integrating capacitors, and T is the period over which the differential integrator INT integrates the current $I_{DC}$. $I_{DC}$ and T are known quantities.

By making adjustments to the capacitance value of integrating capacitors $C_{INT}$ and by, in effect, adjusting the slope of the respective line of the output $V_{OUT\_INT}$ of differential integrator INT, a coarse range for the differential integrator gain is achieved. For example, by making a coarse trim, process variations for the components/elements used in the average current detector 12 are trimmed within a coarse range. However, for purposes of average current going into a charge pump (e.g., from current from a battery to a charge pump), the coarse range and coarse trim may not be enough to satisfy high accuracy requirements. Thus, further adjusting or tuning of the gain of the differential integrator INT may be needed. Therefore, a fine trim is also performed as described below.

Figure 4:
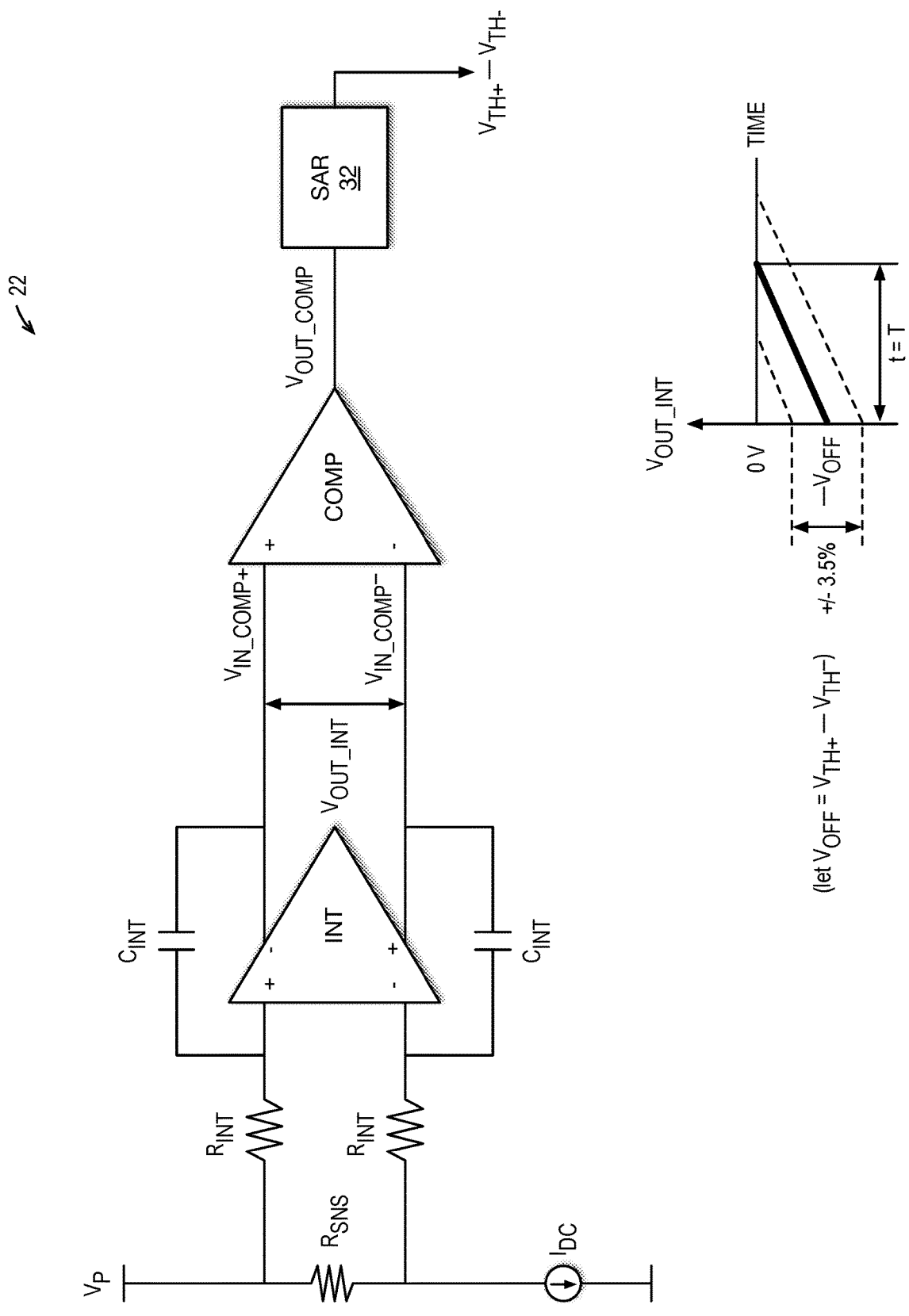
FIG. 4 is a circuit diagram of the current sense system of FIG. 2 and a graph illustrating fine trim of the gain of the differential integrator of FIG. 2 according to embodiments of the present disclosure.

FIG. 4 is a circuit diagram of the current sense system 22 of FIG. 2 and a graph illustrating fine trim of the gain of the differential integrator INT of FIG. 2 according to embodiments of the present disclosure. FIG. 4, as well as equations (2) and (3), are used to illustrate the fine trim of the gain of the differential integrator. An offset $V_{OFF}$, which is the comparator reference threshold $V_{TH+}-V_{TH-}$, at the output of the differential integrator INT exists. Based on the relationships within the equations, the offset $V_{OFF}$ of the output $V_{OUT\_INT}$ of differential integrator INT is utilized and adjusted so errors that occur or exist after the coarse trim is performed are further corrected within a fine range. The fine trim on the offset $V_{OFF}$ corrects for residue gain errors of the coarse trim because the time of integration (e.g., t=0 to T) is fixed. In the example of FIG. 4, the fine range that is achieved for the gain is less than 0.3%. As shown in the graph, the output $V_{OUT\_INT}$ of the differential integrator INT rises linearly from its initial pre-charged value—$V_{OFF}$ to zero Volts over the integration period T such that, in one embodiment, the fine range is accomplished by adjusting the offset $V_{OFF}$ to within plus or minus 3.5%. The adjustment of the offset $V_{OFF}$ in combination with the adjustment of the gain of the differential integrator INT may result in an ability of the current sense system 22 to detect an over-threshold condition of the integrated supply current $I_{VP}$ to within 0.3% accuracy. In other embodiments, accuracy may be further increased by employing circuit techniques such as sizing resistors and reducing amplifier noise.

The offset $V_{OFF}$ is adjusted by adjusting the generated common mode reference $V_{CM}$, e.g., as described in more detail below with respect to FIGS. 5 through 9. As shown in FIG. 4, the SAR data (the received output $V_{OUT\_COMP}$ of the comparator COMP) is used to adjust the offset $V_{OFF}$.

Figure 5:
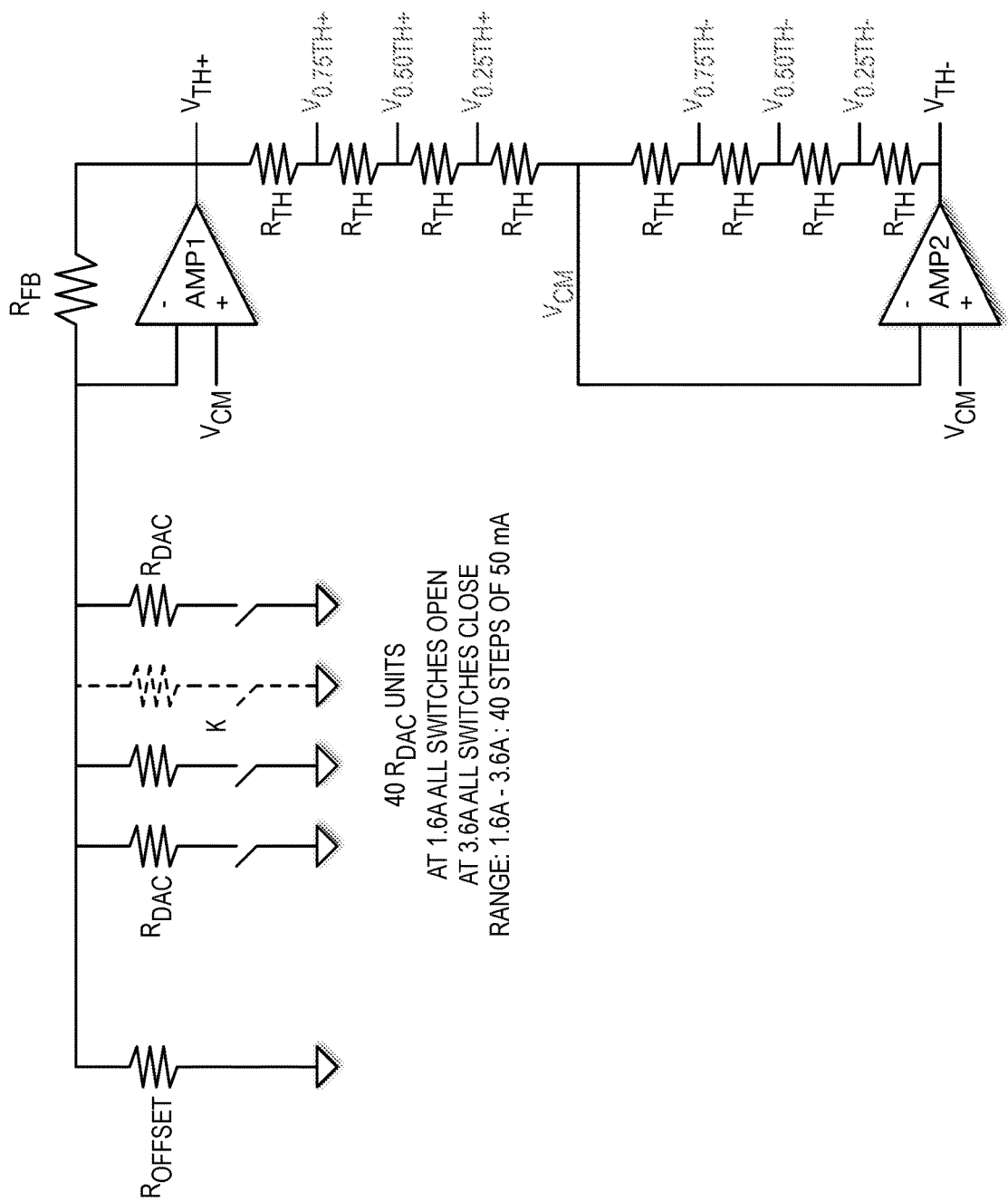
FIG. 5 is a circuit diagram of the comparator reference generator of the current sense system of FIG. 2 according to embodiments of the present disclosure.

FIG. 5 is a circuit diagram of the comparator reference generator 52 of the current sense system 22 of FIG. 2 according to embodiments of the present disclosure. The comparator reference generator 52 converts the common mode voltage reference $V_{CM}$ to the differential threshold voltage $V_{TH+}-V_{TH-}$ to accomplish the fine trim of the differential integrator INT.

The comparator reference generator 52 includes first and second operational amplifiers AMP1 and AMP2 that receive common mode voltage reference $V_{CM}$ on their non-inverting inputs. Amplifier AMP1 generates the positive threshold voltage $V_{TH+}$, and amplifier AMP2 generates the negative threshold voltage $V_{TH-}$. A feedback resistor $R_{FB}$ connects the output and the inverting input of amplifier AMP1. A stack of eight resistors $R_{TH}$ in series connect the outputs of AMP1 and AMP2. The inverting input of AMP2 is connected halfway down the stack of series resistors $R_{TH}$. An offset resistor $R_{OFFSET}$ is connected between ground and the inverting input of amplifier AMP1 and is used to set the differential threshold voltage $V_{TH+}-V_{TH-}$, as described in more detail below. Finally, K DAC resistors $R_{DAC}$ in parallel are connected to the inverting input of amplifier AMP1 and by switches to ground. K specifies the number of closed switches, i.e., the number of connected DAC resistors $R_{DAC}$. In the embodiment of FIG. 5, the value K is programmable between zero and 40 to generate 41 different threshold levels corresponding to a range of 1.6 A to 3.6 A in steps of 50 mA.

The values of $V_{TH+}$ and $V_{TH-}$ may be expressed by equations (4) and (5).

$$V_{TH+} = V_{CM} + V_{CM} * R_{FB} * \left(\frac{1}{R_{OFFSET}} + \frac{K}{R_{DAC}}\right) \quad (4)$$

$$V_{TH-} = V_{CM} - V_{CM} * R_{FB} * \left(\frac{1}{R_{OFFSET}} + \frac{K}{R_{DAC}}\right) \quad (5)$$

In one embodiment, to set a current level of 1.6 A, K=0; to set a current level of 3.6 A, K=40. Additionally, the feedback resistor $R_{FB}$ value is programmable to adjust the differential thresholds to support multiple switching frequencies, e.g., 1.5 MHz, 1.7 MHz, 2 MHz, 2.4 MHz, 3 MHz, and 4 MHz. In one embodiment, after calibration at 3.6 A, a plus or minus 30 mA accuracy is met at 1.6 A. In one embodiment the differential threshold voltage $V_{OFF}$ (i.e., $V_{TH+}-V_{TH-}$) may be scaled by factors of 0.75×, 0.5× and 0.25×, as shown in FIG. 5 to account for corresponding variations in the value of the sense resistor $R_{SNS}$.

Figure 6:
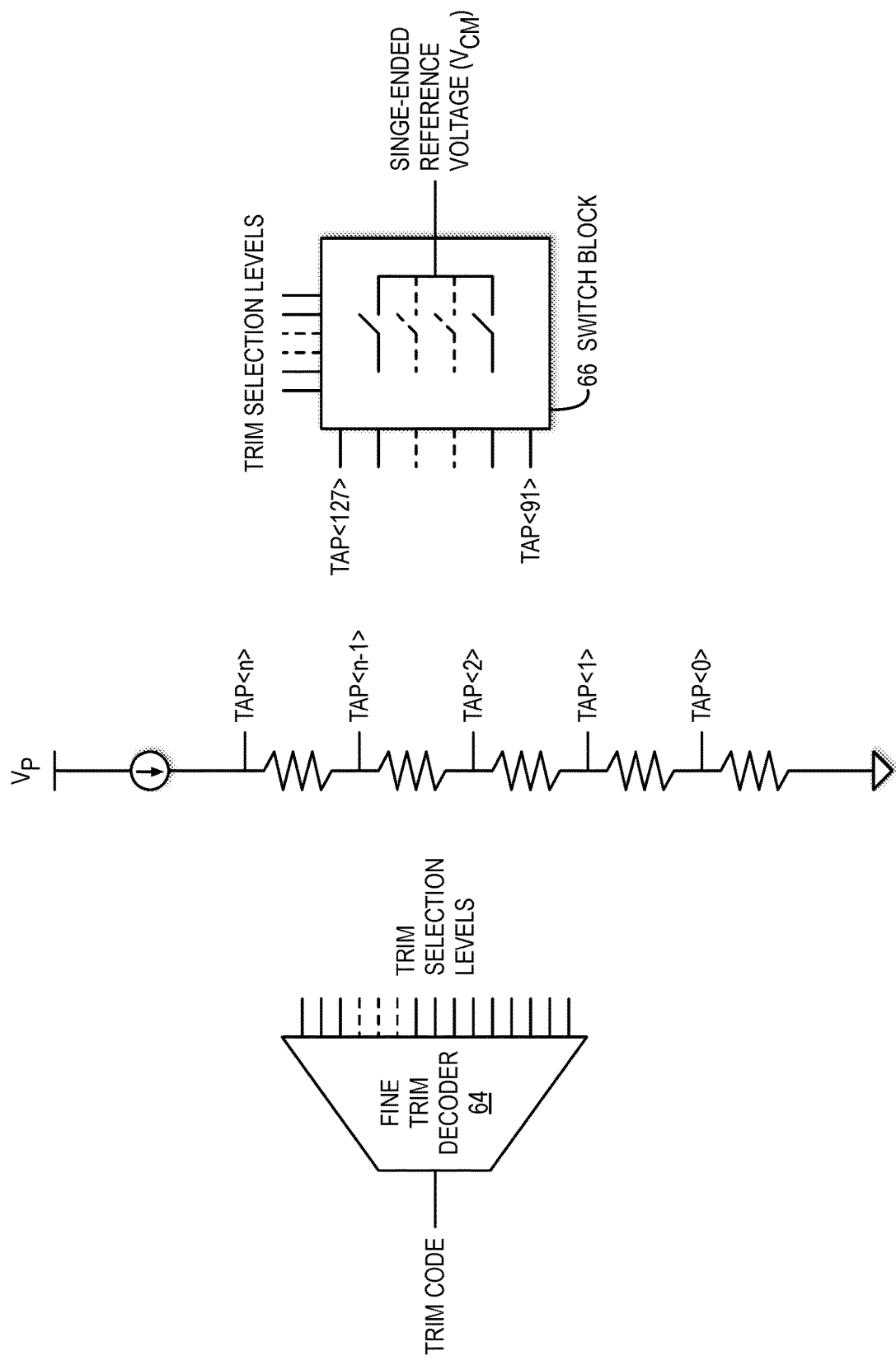
FIG. 6 is a circuit diagram of the reference generator of the current sense system mentioned with respect to FIG. 2 according to embodiments of the present disclosure.

FIG. 6 is a circuit diagram of the single-ended reference generator 62 of the current sense system 22 mentioned with respect to FIG. 2 according to embodiments of the present disclosure. The single-ended reference generator 62 generates the common mode reference voltage $V_{CM}$ in an adjustable fashion to accomplish fine trim of the gain of the differential integrator INT. A representative resistive digital-to-analog converter (DAC) to produce a single-ended voltage $V_{CM}$ is shown in FIG. 6.

The single-ended reference generator 62 includes a fine trim decoder 64 that receives a digital trim code and responsively generates trim selection levels that are provided to a switch block 66 that outputs the single ended reference voltage $V_{CM}$. In one embodiment, the trim code is a 6-bit code. The single-ended reference generator 62 also includes a current source connected between a voltage source $V_P$ (e.g., bandgap voltage) and a stack of series resistors that is connected to ground. Between each pair of resistors is a tap, which are denoted tap<0>, tap<1>, tap<2> through tap<n−1>, tap<n>. The taps are provided as inputs to the switch block 66 which selects the taps based on the trim selection levels to produce a summed voltage that is the single ended reference voltage $V_{CM}$. The calibration sequence updates the trim code which updates the trim selection level which updates the value of the single ended reference voltage $V_{CM}$, e.g., as described in more detail with respect to FIG. 9. The single ended reference voltage $V_{CM}$ is used by the comparator reference generator 52 of FIG. 5 to generate the differential threshold voltage $V_{TH+}-V_{TH-}$ as described above.

Figure 7:
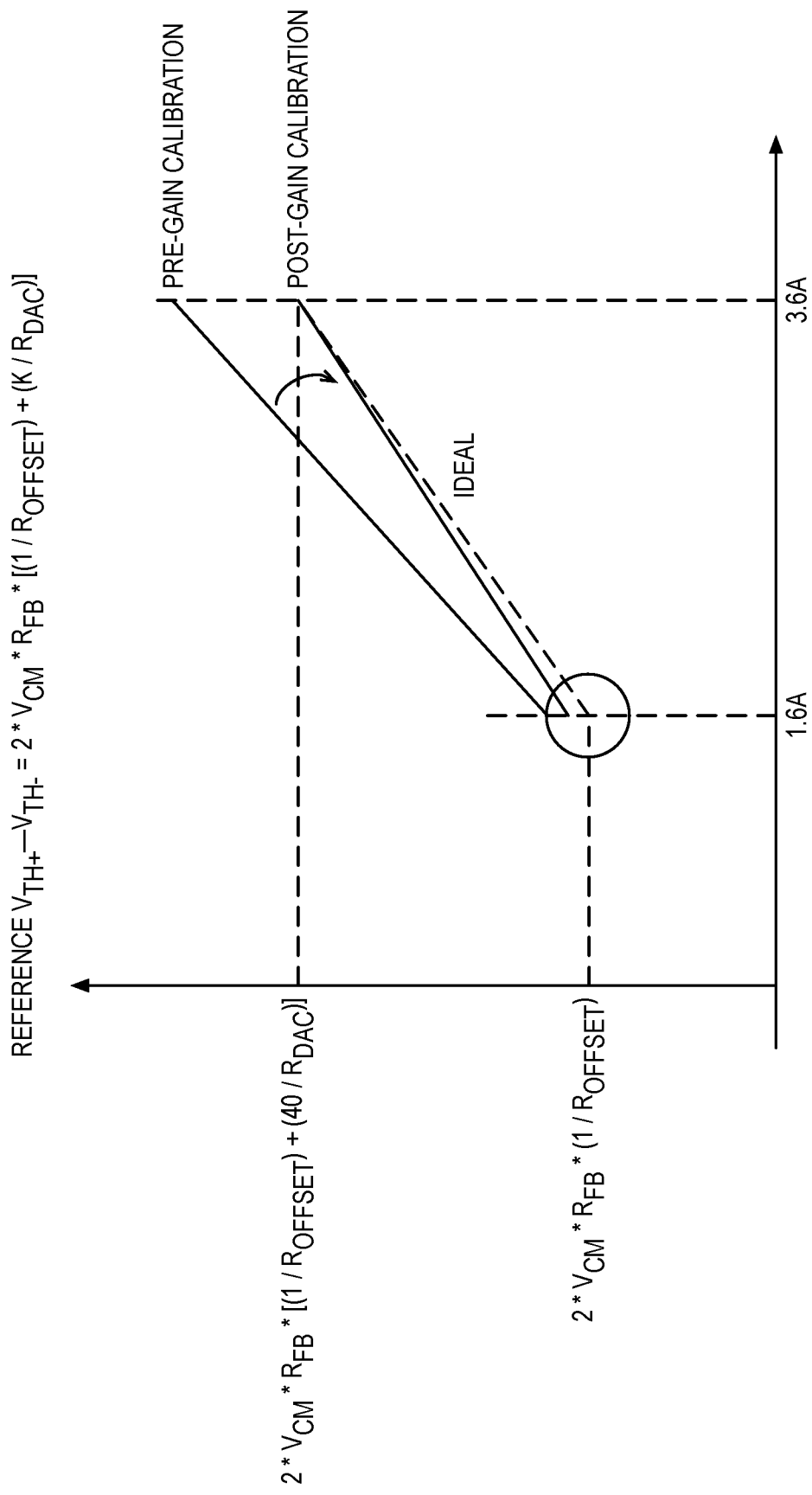
FIG. 7 is a graph illustrating effects of the coarse and fine calibration of the gain of the differential integrator of FIG. 2 according to embodiments of the present disclosure.

FIG. 7 is a graph illustrating effects of the coarse and fine calibration of the gain of the differential integrator INT of FIG. 2 according to embodiments of the present disclosure. The graph depicts current levels on the horizontal axis and the value of the reference generated by the comparator reference generator 52, i.e., the differential threshold voltage $V_{TH+}-V_{TH-}$, on the vertical axis. Subtracting equation (5) from equation (4), the differential threshold voltage $V_{TH+}-V_{TH-}$ may be expressed by equation (6).

$$V_{TH+} - V_{TH-} = 2 * V_{CM} * R_{FB} * \left(\frac{1}{R_{OFFSET}} + \frac{K}{R_{DAC}}\right) \quad (6)$$

Ideally, the differential threshold reference needs to be a value given by expression (7) to detect an integrated current at a threshold of 3.6 A, the differential threshold reference needs to be a value given by expression (8) to detect an integrated current at a threshold of 1.6 A, and the differential threshold reference needed to detect an integrated current at intervening threshold values is along the dotted line shown on the graph between these two points, which are given by equation (6).

$$2 * V_{CM} * R_{FB} * \left(\frac{1}{R_{OFFSET}} + \frac{40}{R_{DAC}}\right) \quad (7)$$

-continued
$$2 * V_{CM} * R_{FB} * \left(\frac{1}{R_{OFFSET}}\right) \quad (8)$$

As shown on the graph by a line labeled pre-gain calibration, prior to gain calibration the slope and the offset of the line may vary significantly from the ideal line. However, advantageously, the slope and the offset of the line are much closer to the ideal line after the coarse and fine calibration are performed.

Finally, although the current sense system 22 may be programmed to detect an over-threshold condition of the integrated supply current $I_{VP}$ for multiple current threshold values (e.g., via programmable K of FIG. 5), a single point calibration may be performed (e.g., at 3.6 A) that meets the accuracy requirements when the threshold is at a different point (e.g., 1.6 A). In order to meet the performance at the other current threshold values, the elements of the resistive DAC of the comparator reference generator 52 of FIG. 5 may need to be sized to meet the accuracy requirement. As shown in the graph, advantageously the accuracy may be met at all current levels (1.6 A through 3.6 A) even though only a single-point calibration (e.g., at 3.6 A) is performed.

Figure 8:
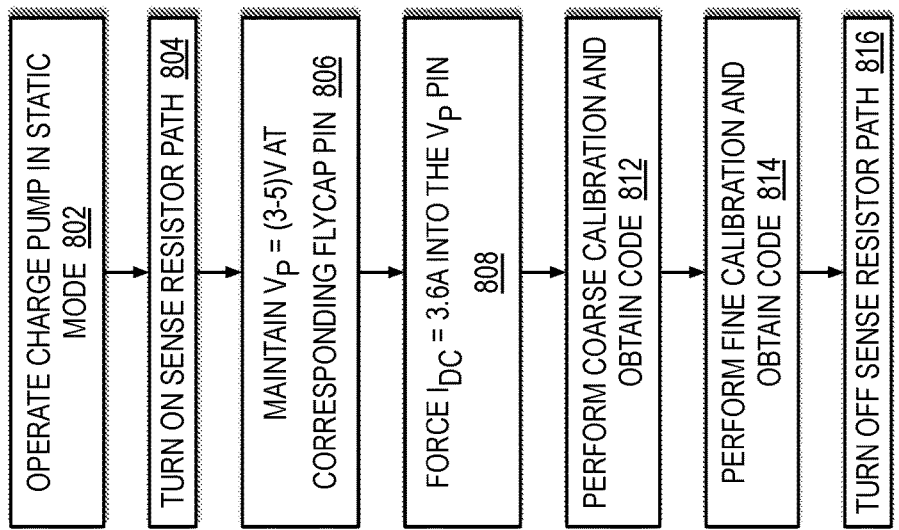
FIG. 8 is a flowchart illustrating a method of coarse and fine calibration according to embodiments of the present disclosure.

FIG. 8 is a flowchart illustrating a method of coarse and fine calibration according to embodiments of the present disclosure. Operation begins at block 802.

At block 802, in a system (e.g., system 10 of FIG. 1) having a charge pump (e.g., charge pump 14 of FIG. 1), the charge pump is operated in a static mode to facilitate calibration. Operation proceeds to block 804.

At block 804, a sense resistor path (e.g., of current sense path 22 of FIG. 2) is turned on. Operation proceeds to block 806.

At block 806, a supply voltage (e.g., supply voltage $V_P$ of FIG. 2) level is maintained (e.g., a level from 3 to 5 Volts) at a corresponding flycap pin (e.g., $C_{INT}$ of FIG. 2). Operation proceeds to block 808.

At block 808, a current is forced into the supply voltage pin (e.g., current $I_{DC}$ of FIG. 3 with a value of 3.6 A). Operation proceeds to block 812.

At block 812, a coarse calibration is performed on the sense resistor path, e.g., obtaining a trim code of the variable capacitance integrating capacitors $C_{INT}$ of FIG. 3 to adjust and set the gain of differential integrator INT so that the output of the differential integrator INT crosses a zero value at the end of an integration period according to FIG. 3. The coarse calibration of block 812 may be performed in an iterative manner (e.g., according to a SAR algorithm) similar to that described below with respect to FIG. 9. Operation proceeds to block 814.

At block 814, a fine calibration is performed on the current sense path 22, e.g., obtaining a trim code of the resistive DAC of the single-ended reference generator 62 of FIG. 6 that generates the single-ended reference voltage $V_{CM}$, which is used by the comparator reference generator 52 of FIG. 5 to generate the differential comparator reference threshold $V_{TH+}$ and $V_{TH-}$, i.e., to adjust offset $V_{OFF}$ according to FIG. 4, to correct residual errors from the coarse calibration of the gain of the differential integrator INT at block 812. Operation proceeds to block 816.

At block 816, the sense resistor path is turned off.

Figure 9:
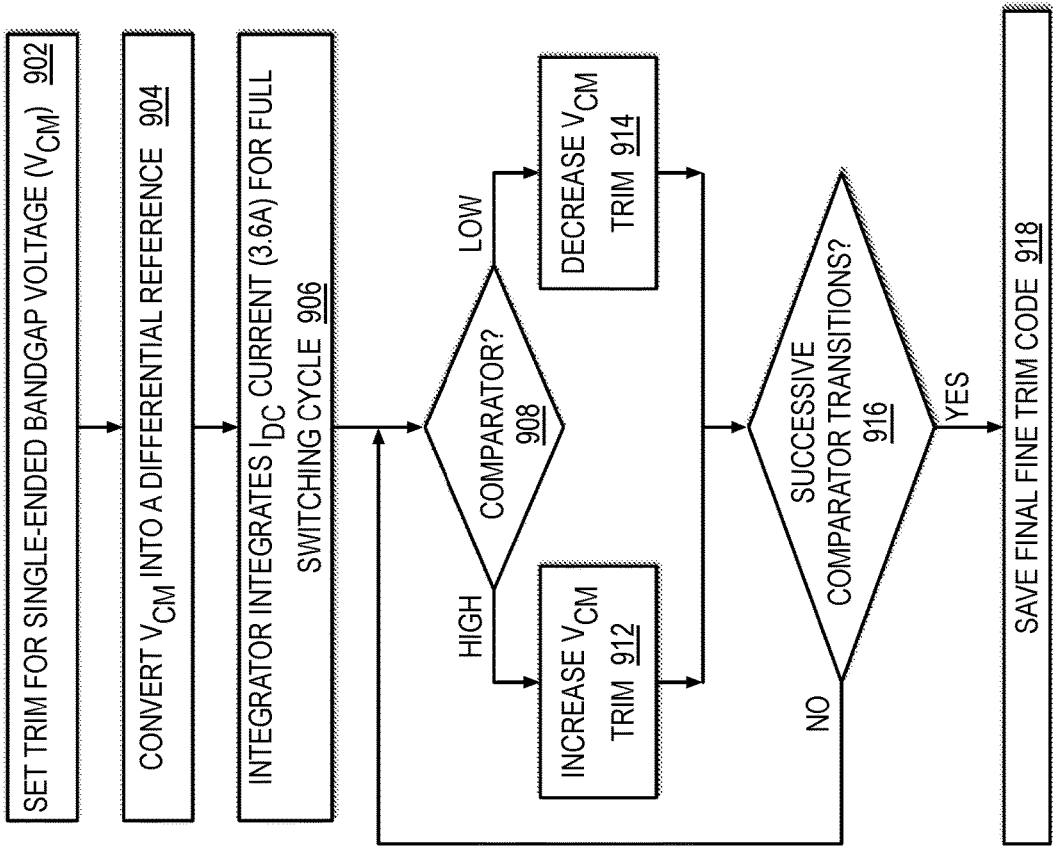
FIG. 9 is a flowchart illustrating in more detail a method of fine calibration according to embodiments of the present disclosure.

FIG. 9 is a flowchart illustrating in more detail a method of fine calibration (e.g., operation at block 814 of FIG. 8) according to embodiments of the present disclosure. Operation begins at block 902.

At block 902, an initial trim code is set for the resistive DAC of the single-ended reference generator 62 of FIG. 6 to generate the single-ended voltage reference (e.g., bandgap voltage) $V_{CM}$. Operation proceeds to block 904.

At block 904, the comparator reference generator 52 of FIG. 5 converts the single-ended voltage reference $V_{CM}$ to the differential comparator reference threshold $V_{TH+}$ and $V_{TH-}$. Operation proceeds to block 906.

At block 906, the differential integrator INT integrates the current $I_{DC}$ (e.g., 3.6 A) for a full integration period T. Operation proceeds to decision block 908.

At decision block 908, if the output $V_{OUT\_COMP}$ of the comparator COMP is high, operation proceeds to block 912; otherwise, operation proceeds to block 914.

At block 912, the trim code of the resistive DAC is increased to increase the level of the single-ended voltage reference $V_{CM}$. Operation proceeds to decision block 916.

At block 914, the trim code of the resistive DAC is decreased to decrease the level of the single-ended voltage reference $V_{CM}$. Operation proceeds to decision block 916.

At decision block 916, if there was a transition of the level of the output $V_{OUT\_COMP}$ of the comparator COMP from the current instance of blocks 902 to blocks 908 to the previous instance of blocks 902 to blocks 908, which indicates the desired trim code has been obtained, operation proceeds to block 918; otherwise, operation returns to decision block 908 to continue iterating to search for the desired trim code.

At block 918, the current trim code is saved as the final trim code.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. An apparatus for calibrating a differential circuit that includes a differential integrator having an input, a gain, and an output connected to a comparator, wherein the differential integrator output is chargeable to a threshold prior to an integration period, wherein the differential integrator integrates the input during the integration period such that the differential integrator output goes toward zero from the threshold, wherein the comparator detects the output of the differential integrator reaching zero, the apparatus comprising:
    a closed-loop gain trim circuit to perform a coarse calibration to adjust and set the gain of the differential integrator;
    a reference generator that generates the threshold to which the differential integrator output is pre-charged; and
    wherein the reference generator is trimmable during a fine calibration to adjust and set the threshold to correct for residual gain error in the differential circuit remaining after the coarse calibration is performed.

2. The apparatus of claim 1,
    wherein the input of the differential integrator senses a current drawn from a voltage source/supply; and
    wherein the differential circuit is operable to detect the over-threshold condition of an average current drawn from the voltage source/supply if the comparator detects the output of the differential integrator reaches zero.

3. The apparatus of claim 2,
    wherein after the coarse calibration and fine calibration are performed, the differential circuit is configured to detect the over-threshold condition of the average current drawn from the voltage source/supply with a range of error less than 0.3%.

4. The apparatus of claim 2,
    wherein the input of the differential integrator senses the current drawn from the voltage source/supply across a sense resistor;
    wherein a resistance value of the sense resistor is configurable to a plurality of different values; and
    wherein the threshold generated by the reference generator is scalable to a plurality of different values corresponding to the plurality of different configurable resistance values of the sense resistor.

5. The apparatus of claim 1,
    wherein the fine calibration is performed by sourcing a known current value to the differential circuit for a known value of the integration period and adjusting the threshold in an iterative manner until successive transitions of the output of the comparator are detected.

6. The apparatus of claim 1,
    wherein the reference generator comprises a trimmable digital-to-analog converter (DAC).

7. The apparatus of claim 6,
    wherein the fine calibration applies a successive approximation register (SAR) algorithm to the trimmable DAC.

8. The apparatus of claim 6,
wherein the reference generator is programmable to a plurality of different values of the threshold; and
wherein the coarse calibration and fine calibration are performed at a single programmed value of the plurality of different values of the threshold.

9. The apparatus of claim 8,
wherein resistive elements of the DAC are accurately sized to achieve a range of error less than 0.3% for detection of an over-threshold condition for each of the plurality of different values of the threshold after performance of the coarse calibration and fine calibration at the single value.

10. The apparatus of claim 1,
wherein the coarse calibration comprises adjusting and setting a capacitance of an integrating capacitor of the differential integrator or an integrating resistor of the differential integrator.

11. The apparatus of claim 1,
wherein single-ended outputs of the differential integrator concurrently cross a common mode reference when the output of the differential integrator reaches the zero value;
wherein the reference generator converts the common mode reference to the threshold; and
wherein the reference generator is trimmable during the fine calibration to adjust and set the threshold by adjusting and setting the common mode reference.

12. The apparatus of claim 1,
wherein the reference generator is adjustable to support a plurality of different values of the integration period.

13. A method for calibrating a differential circuit that includes a differential integrator having an input, a gain, and an output connected to a comparator, wherein the differential integrator output is chargeable to a threshold prior to an integration period, wherein the differential integrator integrates the input during the integration period such that the differential integrator output goes toward zero from the threshold, wherein the comparator detects the output of the differential integrator reaching zero, the method comprising:
performing, in a closed-loop manner, a coarse calibration to adjust and set the gain of the differential integrator; and
performing a fine calibration of a trimmable reference generator that generates the threshold to which the differential integrator output is pre-charged by adjusting and setting the threshold to correct for residual gain error in the differential circuit remaining after the coarse calibration is performed.

14. The method of claim 13,
wherein the input of the differential integrator senses a current drawn from a voltage source/supply; and
wherein the differential circuit is operable to detect the over-threshold condition of an average current drawn from the voltage source/supply if the comparator detects the output of the differential integrator reaches zero.

15. The method of claim 14,
wherein after the coarse calibration and fine calibration are performed, the differential circuit is configured to detect the over-threshold condition of the average current drawn from the voltage source/supply with a range of error less than 0.3%.

16. The method of claim 14,
wherein the input of the differential integrator senses the current drawn from the voltage source/supply across a sense resistor;
wherein a resistance value of the sense resistor is configurable to a plurality of different values; and
wherein the threshold generated by the reference generator is scalable to a plurality of different values corresponding to the plurality of different configurable resistance values of the sense resistor.

17. The method of claim 13,
wherein said performing the fine calibration comprises sourcing a known current value to the differential circuit for a known value of the integration period and adjusting the threshold in an iterative manner until successive transitions of the output of the comparator are detected.

18. The method of claim 13,
wherein the reference generator comprises a trimmable digital-to-analog converter (DAC).

19. The method of claim 18,
wherein said performing the fine calibration comprises applying a successive approximation register (SAR) algorithm to the trimmable DAC.

20. The method of claim 18,
wherein the reference generator is programmable to a plurality of different values of the threshold; and
wherein said performing the coarse calibration and the fine calibration are performed at a single programmed value of the plurality of different values of the threshold.

21. The method of claim 20,
wherein resistive elements of the DAC are accurately sized to achieve a range of error less than 0.3% for detection of an over-threshold condition for each of the plurality of different values of the threshold after performance of the coarse calibration and fine calibration at the single value.

22. The method of claim 13,
wherein said performing the coarse calibration comprises adjusting and setting a capacitance of an integrating capacitor of the differential integrator or an integrating resistor of the differential integrator.

23. The method of claim 13,
wherein single-ended outputs of the differential integrator concurrently cross a common mode reference when the output of the differential integrator reaches the zero value;
wherein the reference generator converts the common mode reference to the threshold; and
wherein said performing a fine calibration by adjusting and setting the threshold comprises adjusting and setting the threshold by adjusting and setting the common mode reference.

24. The method of claim 13,
wherein the reference generator is adjustable to support a plurality of different values of the integration period.

25. A non-transitory computer-readable medium having instructions stored thereon that are capable of causing or configuring an apparatus for calibrating a differential circuit that includes a differential integrator having an input, a gain, and an output connected to a comparator, wherein the differential integrator output is chargeable to a threshold prior to an integration period, wherein the differential integrator integrates the input during the integration period such that the differential integrator output goes toward zero from the threshold, wherein the comparator detects the output of the differential integrator reaching zero, wherein the instructions cause or configure the apparatus to perform operations comprising:

performing, in a closed-loop manner, a coarse calibration to adjust and set the gain of the differential integrator; and performing a fine calibration of a trimmable reference generator that generates the threshold to which the differential integrator output is pre-charged by adjusting and setting the threshold to correct for residual gain error in the differential circuit remaining after the coarse calibration is performed.

* * * * *